United States Patent [19]
Maurer et al.

[11] Patent Number: 5,608,319
[45] Date of Patent: Mar. 4, 1997

[54] METHOD AND APPARATUS FOR MEASURING MAGNETIC FIELDS WITH MAGNETIC FIELD POLARITY DISPLAY AND ZERO POINT ADJUSTMENT

[75] Inventors: Albert Maurer, Zollikerberg; Urs Meyer, Niederglatt, both of Switzerland

[73] Assignee: Maurer Magnetic AG, Switzerland

[21] Appl. No.: 178,308

[22] PCT Filed: Apr. 16, 1993

[86] PCT No.: PCT/CH93/00098
§ 371 Date: Mar. 2, 1994
§ 102(e) Date: Mar. 2, 1994

[87] PCT Pub. No.: WO93/23761
PCT Pub. Date: Nov. 25, 1993

[30] Foreign Application Priority Data

May 11, 1992 [CH] Switzerland ............... 1499/92

[51] Int. Cl.$^6$ ............ G01R 33/02; G01R 33/07; G01R 13/02; G01R 15/08
[52] U.S. Cl. ............ 324/251; 324/103 P; 324/115; 324/133; 324/260
[58] Field of Search .............. 324/225, 244, 324/251, 252, 260, 99 D, 103 P, 115, 119, 133

[56] References Cited

U.S. PATENT DOCUMENTS

| | | | |
|---|---|---|---|
| 3,600,678 | 8/1971 | Garrett et al. | 324/133 |
| 4,166,245 | 8/1979 | Roberts | 324/103 P |
| 4,550,287 | 10/1985 | Babcock | 324/133 |
| 5,319,305 | 6/1994 | Baba | 324/115 |
| 5,343,145 | 8/1994 | Wellman et al. | 324/251 X |

FOREIGN PATENT DOCUMENTS

| | | |
|---|---|---|
| 0438637 | 7/1991 | European Pat. Off. . |
| 2171207 | 8/1986 | United Kingdom . |

OTHER PUBLICATIONS

T. Y. Fujita et al., "Portable Magnetic Field Dosimeter with Data Acquisition Capabilities", *Review of Scientific Instruments*, vol. 53, No. 3, pp. 326–331, Mar. 1982.

M. W. Poole and R. P. Walker, "Hall Effect Probes and Their Use in a Fully Automated Magnetic Measuring Systems", IEEE *Transactions on Magnetics*, vol. MAG–17, No. 5, pp. 2129–2132, Sep. 1981.

*Primary Examiner*—Gerard R. Strecker
*Attorney, Agent, or Firm*—Speckman, Pauley & Fejer

[57] ABSTRACT

A method and apparatus for measuring magnetic fields with a magnetically sensitive probe which is introduced into a magnetic field and which transmits a measuring signal to a measuring device for evaluation. After activating the measuring device, a zero point is measured and automatically set and a correction value is calculated and stored. The probe is introduced into the magnetic field and the polarity of the magnetic field automatically determined. A peak value of a plurality of measured values is automatically stored and the measurement range of the device is automatically adjusted to the range of the magnetic field. Thereafter, the measured values are read out, the probe is removed from the magnetic field and the device is switched off.

19 Claims, 2 Drawing Sheets

METHOD AND APPARATUS FOR MEASURING MAGNETIC FIELDS WITH MAGNETIC FIELD POLARITY DISPLAY AND ZERO POINT ADJUSTMENT

BACKGROUND OF THE INVENTION

1. Field of the Invention

This invention relates to a method and device for measuring magnetic fields whereby a magnetically sensitive probe is introduced into a magnetic field to be measured and transmits a signal to a measuring device for evaluation.

2. Description of the Prior Art

The technique for measuring magnetic fields using Hall probes is known from the literature. For example, the firm of List-Magnetik GmbH, D-7022 Leinfelden-Echterdingen offers such a portable magnetic field measuring device under the name of MP-U. This device is suitable for measuring time-constant fields in both directions of polarity (north and south pole), and selectively also for measuring alternating fields. As operating elements, the device has respectively one selection switch for the type of display (constant or alternating field, as well as peak value memory) and the measuring range, a key for resetting the peak value indication and a rotating knob for setting the zero point.

A similar device is offered by the firm of Walker Scientific Inc., Worcester, Mass., USA, under the model designation MG-5DP. This device also has essentially the same operating elements: a function selector, a measuring range selector, a peak value reset key and a zero point setting knob. As with the first mentioned device, a digital display is disposed at the front face of the measuring device. The magnetic field probe is connected to the device by a cable.

In actual, use these measuring devices are uncomfortable to handle and complicated to operate. Often the setting of the zero point is omitted when activating the device. This causes continuously faulty readings if subsequently the zero point setting is inadvertently changed.

The selection of the measuring range requires an intervention at the measuring device which distracts from the actual measuring task. Areas having different field strengths are again and again contacted, especially in the course of diagnosing magnetic fields, which always requires a correction of the measuring range. For peak value measurement, the magnitude of the value must be known in order to use the indicator.

The measurement of magnetic fields requires the continuous correlation of the probe position and the measured value. This, in turn requires alternating observation of the probe and the display.

SUMMARY OF THE INVENTION

It is an object of this invention to provide a method for measuring magnetic requiring considerably fewer manual interventions than know methods, and automating the measurement steps as much as possible.

It is another object of this invention to provide a measuring device which simplifies the operation of the method and requires only a minimum of interventions.

It is yet another object of this invention to provide a method for measuring magnetic fields in which with automatic zero point setting and corresponding measuring value compensation, the local magnetic field and any occurring smaller interference fields are automatically considered and compensated for thereby minimizing false measurements.

It is yet another object of this invention to provide a device for measuring magnetic fields with which the measured value can be read off the measuring device as well as the probe body itself.

These and other objects of this invention are achieved by a method and device for measuring magnetic fields in which the device for measuring magnetic fields, having a magnetically sensitive probe and a measuring device, is activated, automatically measuring and setting the zero point and calculating and storing the resulting correction value. The probe is introduced into a magnetic field to be measured, automatically monitoring, using feedback, polarity and appropriately switching the measuring device. The peak value of the measured values is automatically stored with automatic adaptation of the measurement range of the device to the range of the magnetic field being measured. The measured values are then read, after which the probe is removed from the magnetic field and the measuring device is switched off.

BRIEF DESCRIPTION OF THE DRAWINGS

This invention will be better understood from the following detailed description taken in conjunction with the drawings wherein.

DESCRIPTION OF PREFERRED EMBODIMENTS

The method for measuring magnetic fields a using magnetically sensitive probe which is introduced into a magnetic field to be measured, generating a signal and transmitting it to a measuring device for evaluation, comprises the following steps in the following sequence: activating the measuring device, automatically measuring and setting the zero point along with calculation of the correction value and its storage, introducing the probe into a magnetic field to be measured, automatically monitoring, with feedback, polarity and appropriately switching the measuring device, automatically storing the peak value of the measured values while automatically adjusting the measurement range to the range of the magnetic field to be measured, reading the measured values, removing the probe from the magnetic field switching off the measuring device.

Read-out of the measured values is performed from a display field on the measuring device or the probe body. The read-outs can also be automated using computers through interfaces for data transfer.

A signal from the probe itself, which is emitted by the Hall probe after activation of the measuring device, is used for automatic zero point setting of the measuring device, wherein the measured value of the signal from the probe itself is stored and this value is compensated through a control amplifier during all future measurements. The zero point setting is again performed after an arbitrary number of measurements.

The measuring signal is supplied to a discriminator which discriminates between a magnetic field which is constant in its polarity and a magnetic field which alternates in polarity over time and which emits a respective signal used for the control of further signal processing.

If a magnetic field of constant polarity is present, the mean value of the measuring signal is automatically formed and displayed.

However, if a magnetic field having alternating polarity is present, the absolute value of the measuring signal is automatically determined and its mean value is displayed; or the effective value of the measuring signal is determined and displayed as required.

Figure 1:
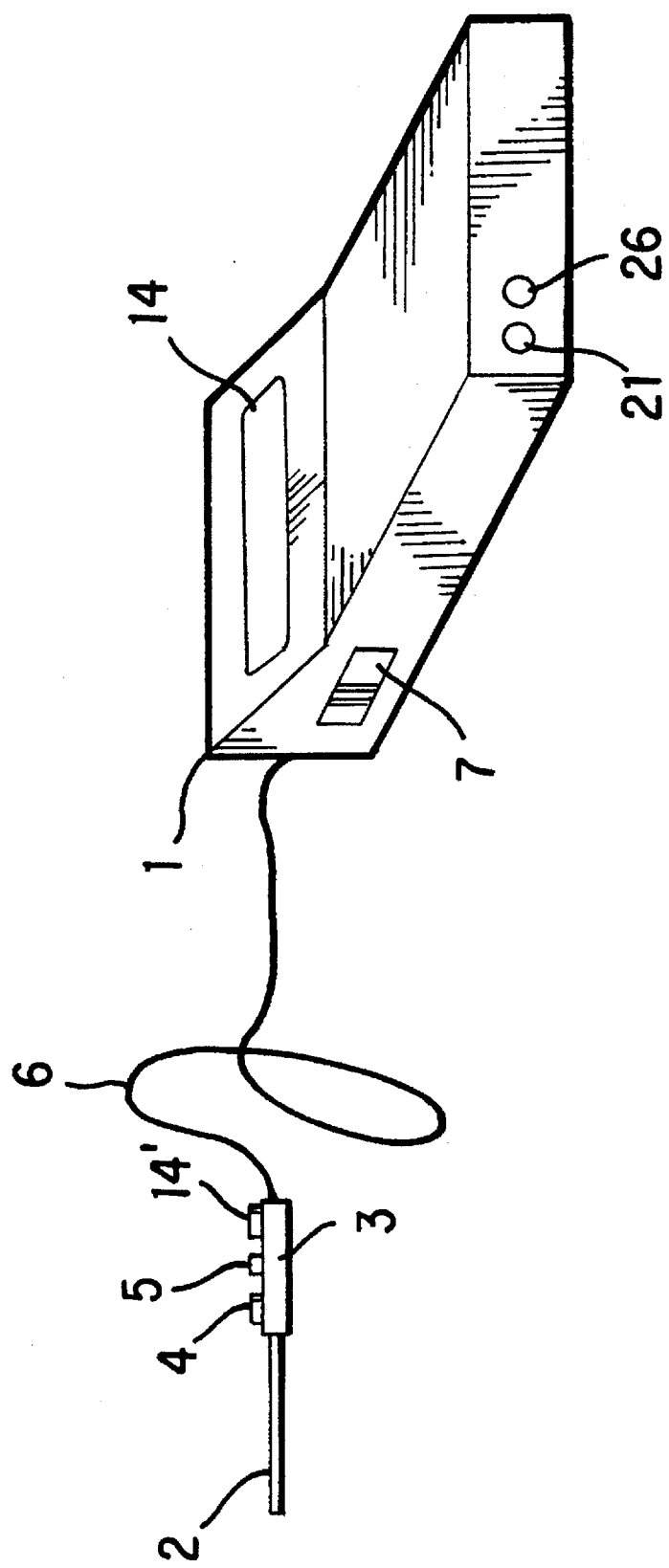
FIG. 1 illustrates the essential operation elements of a device for measuring magnetic field and FIG. 2 is a schematic diagram of the interconnection of the individual function modules of the device for measuring megnetic fields in accordance with one embodiment of this invention.

FIG. 1 shows a measuring device and probe. The magnetic field to be measured is detected by a Hall probe 2, which generates a voltage proportional to the magnetic field. The probe housing 3 is used for comfortable handling of the probe. It contains a multi-colored display 4 in the form of light-emitting diodes in the colors red and green which, when simultaneously lit, result in the third color yellow. The probe housing 3 furthermore contains a key 5 for the function selection of the peak value display. The probe housing 3 is connected to the display housing 1 of the measuring device by a cable 6. The measured value is displayed at the digital LCD display 14 on the measuring device. For easier handling in certain applications, a further measured value display 14' is disposed on the probe housing 3.

In accordance with one embodiment of this invention, the measured value display 14' is designed as a qualitative display which only shows the measured range in steps. A number of LEDs analogously show the magnitude of the measured values. In accordance with another embodiment, the measured value display 14' is designed as a quantitative display with LCDs such that the measured values are immediately shown digitally on the measuring device, the same as with the measured value display 14.

Figure 2:
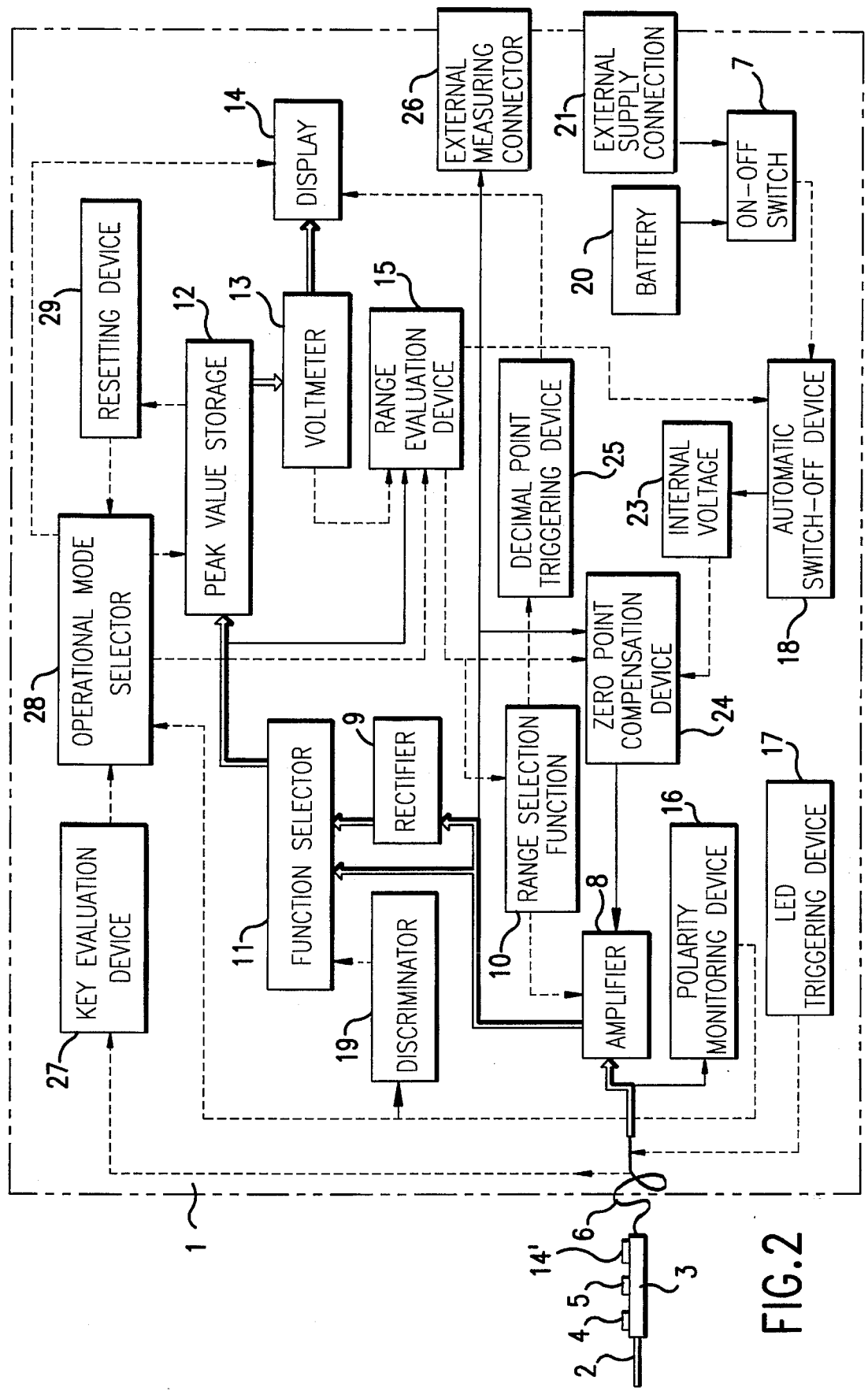

The device is activated by on-off switch 7. The plug 21 is used for connection to an external power supply as an alternative to the internal battery 20, as shown in FIG. 2. The amplified signal of the Hall probe can be picked up at the external measuring connector 26, for example, for further testing with an oscilloscope.

FIG. 2 shows the interconnection of the individual function modules of the device in accordance with one embodiment of this invention. With the exception of the amplifier and the power supply, the functions shown can be realized by individual digital control circuits or a microprocessor. In the case of a microprocessor, the functions are not realized physically, but rather are in the form of program sections. The operation shown here in detail is based upon the first variant.

The measuring signal supplied by the Hall probe 2 is amplified in the amplifier 8. The amplification can be set in steps in order to perfectly detect magnetic fields of different magnitudes. This step-like setting is accomplished with the aid of the range selection function 10. The output signal of the amplifier is supplied without further conversion to an output jack for external measuring connector 26.

The amplified measuring signal is supplied to the function selector 11 on the one hand directly, or alternatively through the measurement rectifier 9. The measurement rectifier 9 is preferably designed as root-mean-square value former. Known integrated control circuits, such as the type AD 636 of the manufacturer Analog Devices, are available for this purpose. The mechanical force of the magnetic field is particularly well displayed with the conversion to the root-mean-square value. This is due to the fact that the interrelationship between the magnetic field strenght and the mechanical force is a square one. The function selector 11 is triggered by the AC/DC discriminator 19 in such a way that in the presence of a signal with constant polarity, function selector 11 receives the measuring signal directly from the amplifier 8. In the case of quickly alternating polarity, the AC/DC discriminator 19 generates a control signal having the meaning "alternating field". In this case, the function selector 11 receives the signal which was transformed through the measuring rectifier 9.

Thereafter, the measuring signal reaches the peak value storage 12 which is triggered by the operational mode selector 28. The peak value storage 12 has three different modes of operation: direct display, peak value positive, peak value negative. The peak value storage is not in operation for the direct display. To display the peak value, its output signal follows the input signal until a maximum is reached, which is then stored and is continuously applied to the output until either an even higher value is measured or until cancellation of the storage takes place by resetting to the direct display.

Thereafter the measuring signal arrives at the digital voltmeter 13 which in turn triggers the LCD display 14. Both parts are well known electrical components and available on the market.

The range evaluation device 15 is provided for the automatic switching of the measuring range. It assures that, with a low measuring signal, a more sensitive measuring range, that is, a greater amplification, is selected in the amplifier 8 while, if the measuring range of the digital voltmeter 13 is exceeded, a less sensitive measuring range with a correspondingly lesser amplification is used. On the one hand, the automatic range evaluation device is controls the range selection function 10 of the amplifier 8; on the other hand, it controls through range selection function 10 the position of the decimal point on the display 14 through the decimal point triggering device 25.

Evaluation of the measuring signal is preferably performed in two ways: exceeding of the measuring range by evaluation of the appropriate output signal of the digital voltmeter 13, or falling below it by monitoring the amplified measuring signal downstream of the function selector 11. Measurement is always started with the most sensitive range. In the case of the peak value measurement, it is necessary to inhibit the down-switching into a more sensitive range. This is accomplished by an appropriate signal from the operational mode selector 28.

The selection of the operational mode is performed in a particularly comfortable manner by introduction of the probe into an appropriate magnetic field and a short depression of the key 5. The key signal is evaluated in the key evaluation device 27 and arrives at the operational mode selector 28. During the depression of the key, the operational mode selector 28 receives the information regarding the polarity of the signal from the polarity monitoring device 16. In the presence of a constant negative polarity, the peak value storage 12 is set to detecting the negative peak value, and to store such negative peak value. In case of a positive or quickly alternating polarity (alternating field), the peak value storage 12 is set to detect the positive peak value. In the process, the measuring rectifier 9 provides a positive output signal in each case.

Resetting of the peak value storage 12 to the operational mode of direct display is achieved either by another brief depression of the key or by a timing circuit for the automatic resetting device 29. The automatic resetting device 29 assures that in case of non-use of the measuring device for one minute, for example, it returns in each case to direct display. This function aids the automatic shut-off of the device in case of non-use and prevents false interpretation of the display. In addition, the functional mode of peak value is indicated by a special symbol on the LCD.

When placing the device into operation, an automatic zero adjustment assures the compensation of the zero point storage. With Hall probes, this represents a considerable problem, because their zero point signal is greatly temperature-dependent. When starting up the device, the increase in the internal supply voltage 23 simultaneously triggers the automatic zero point compensation device 24. The zero point correction signal is directly determined for a short time by the output signal of the amplifier 8 through a control amplifier and a digital storage circuit. Subsequently, this value is continuously retained and the amplifier is freed for its normal function. This direct return of the output signal to the zero point input of the amplifier 8 results in the output voltage of the zero point compensation device 24 exactly compensating the zero point storage of the Hall probe 2. In actual use, this switch-through-storage function is made possible by the component AD 7569 of the manufacturer Analog Devices, Norwood Mass., USA.

The polarity of the measuring signal is directly detected at the output signal of the Hall probe 2 by the polarity monitoring device 16. The polarity monitoring device generates a triple definition signal: Hall signal positive, Hall signal negative, Hall signal zero (or very weak). These three definitions are processed for operating the multi-color display 4 in the LED triggering device 17. The positive signal causes the red color of the LED to radiate, the negative signal appropriately the green color. Rapidly alternating polarity results in the mixed color yellow. The triple definition signal is also used for triggering the AC-DC discriminator 19 and the operational mode selector 28. The particular advantage of this circuit is that, when the multicolor display radiates, the user can immediately determine which type of peak value storage is selected by the key depression.

Supply of the device from the battery 20 or the external supply connection 21 via on-off switch is accomplished in a known manner. To avoid excessive consumption of the battery, the measuring device is switched off by the automatic switch-off device 18 when the Hall probe 2 has not supplied a signal which is clearly different from zero over an extended period of time. When falling below the switch-point, the range evaluation device 15 emits an appropriate signal for switching down the measuring range, which is always present in the lowest, this is, the most sensitive measuring range, as long as no measurements are performed. This time is monitored by a timing switch which is reset when the switching point has been exceeded, but otherwise turns the device off after a period of time of several minutes, for example, has passed.

We claim:

1. A method for measuring magnetic fields with a magnetically sensitive probe which, in a magnetic field to be measured, transmits a measuring signal to a measuring device for evaluation, comprising the steps of: activating the measuring device, automatically determining and setting a zero reference point with respect to said magnetic field and calculating and storing a zero reference point correction value, introducing the probe into said magnetic field to be measured, generating a measuring signal, automatically monitoring polarity of said measuring signal and upon detecting an alternating polarity of said measuring signal automatically rectifying said measuring signal, automatically storing a peak value of a plurality of at least one of measured values and rectified measured values of the measuring signal and automatically adjusting a measurement range of the measuring device based upon said measuring signal to a range of the strength of the magnetic field to be measured, reading out said at least one of said measured values and said rectified measured values, removing the probe from the magnetic field to be measured and switching off the measuring device.

2. A method in accordance with claim 1, wherein, for automatic zero point setting of the measuring device, a signal from the probe, which is emitted by the probe after activation of the measuring device, is stored as a value, and this value is compensated through a control amplifier for all further measurements.

3. A method in accordance with claim 2, wherein the zero point setting is again performed after an arbitrary number of measurements.

4. A method in accordance with claim 1, wherein the measuring signal is supplied to a discriminator, which discriminates between a constant polarity magnetic field having a constant polarity and an alternating polarity magnetic field which alternates in polarity over time, and which emits a respective signal which is used for controlling further signal processing.

5. A method in accordance with claim 4, wherein, if said constant polarity magnetic field is present, a mean value of the measuring signal is automatically determined and displayed.

6. A method in accordance with claim 4, wherein, if said alternating polarity magnetic field is present, an absolute value of the measuring signal is automatically determined and its mean value is displayed.

7. A method in accordance with claim 4, wherein, if said alternating polarity magnetic field is present, an effective value of the measuring signal is determined and displayed.

8. In a device for measuring magnetic fields having a magnetic field-sensitive probe on a probe body and a measuring device with a measuring device display, the improvement comprising: the probe body comprising a probe body display of magnetic field polarity which displays one of three conditions, "positive", "negative" and "alternating field"; and said measuring device comprising an analog control circuit, connected to said probe by a cable, with digital storage of a correction value from said probe, said analog control circuit automatically providing and maintaining a zero point adjustment based upon said correction value.

9. A device in accordance with claim 8, wherein a zero point adjustment is performed by a digital calculator circuit with storage of a correction value.

10. A device in accordance with claim 8 the measuring device further comprising a range evaluation device, said range evaluation device automatically adjusting an actual measured value in steps to produce a measuring range.

11. A device in accordance with claim 10, wherein a timing circuit resets a peak value storage, thereby allowing a switch-over to a more sensitive measuring range.

12. A device in accordance with claim 8 the measuring device further comprising a peak value storage, said peak value storage storing a maximum display value.

13. A device in accordance with claim 12 the measuring device further comprising a measurement rectifier, said measurement rectifier making the maximum display value independent of polarity of the magnetic field.

14. A device in accordance with claim 12 the measuring device further comprising an AC/DC discriminator, said AC/DC discriminator automatically determining the maximum display value as an absolute value of a measuring signal when said device is in an alternating polarity magnetic field.

15. A device in accordance with claim 14 the measuring device further comprising a value former, said value former automatically determining an effective value of the measuring signal when said device is in the presence of said alternating polarity magnetic field.

16. A device in accordance with claim 8, wherein a qualitative, analog display of a measuring range is disposed on the probe body.

17. A device in accordance with claim 16 the measuring device further comprising a feedback circuit wherein the measuring device controls the display on the probe body by a feedback signal from said feedback circuit.

18. A device in accordance with claim 8, wherein a quantitative, digital display of a measured value is disposed on the probe body.

19. A device in accordance with claim 18 the measuring device further comprising a feedback circuit wherein the measuring device controls the display on the probe body by a feedback signal from said feedback circuit.

* * * * *